(12) United States Patent
Maunuksela

(10) Patent No.: US 7,002,425 B2
(45) Date of Patent: Feb. 21, 2006

(54) PULSE MODULATION

(75) Inventor: Jaako Maunuksela, Espoo (FI)

(73) Assignee: Nokia Corporation, Espoo (FI)

( * ) Notice: Subject to any disclaimer, the term of this patent is extended or adjusted under 35 U.S.C. 154(b) by 81 days.

(21) Appl. No.: 10/663,350

(22) Filed: Sep. 16, 2003

(65) Prior Publication Data

US 2005/0057319 A1    Mar. 17, 2005

(51) Int. Cl.
*H03K 7/04* (2006.01)
(52) U.S. Cl. .................. 332/112; 713/500; 327/164; 327/291
(58) Field of Classification Search ............... 332/108, 332/109, 112; 713/500; 327/164, 291
See application file for complete search history.

(56) References Cited

U.S. PATENT DOCUMENTS

| 5,699,005 | A | 12/1997 | Menkhoff et al. ........... 327/292 |
| 6,194,971 | B1 * | 2/2001 | Glen et al. ................... 331/57 |
| 6,439,679 | B1 | 8/2002 | Roylance ........................ 347/9 |
| 2003/0058956 | A1 | 3/2003 | Rosnell et al. |

FOREIGN PATENT DOCUMENTS

| EP | 0712211 | 5/1996 |
| JP | 06326574 | 11/1994 |
| JP | 08051346 | 2/1996 |
| JP | 08102660 | 4/1996 |

OTHER PUBLICATIONS

A. Jayaraman et al., "Linear High-Efficiency Microwave Power Amplifiers Using Bandpass Delta-Sigma Modulators," IEEE Microwave and Guided Wave Letters, vol. 8, No. 3, Mar. 1998, pp. 121-123.

* cited by examiner

*Primary Examiner*—Arnold Kinkead
(74) *Attorney, Agent, or Firm*—Alfred A. Fressola; Ware, Fressola, Van Der Sluys & Adolphson LLP

(57) ABSTRACT

A pulse modulator comprises a delay arrangement for receiving a first sequence of pulses and for delaying each received pulse several times to obtain a plurality of sequences of pulses having different phases. The pulse modulator further comprises a selection component for receiving from the delay arrangement a plurality of sequences of pulses having different phases, for receiving a modulating signal, wherein each possible value of the modulating signal is associated to one of the different phases, for selecting for each pulse of the first sequence of pulses a pulse of the respective sequence of pulses which sequence of pulses has a phase associated to a current value of the modulating signal, and for outputting the selected pulse as part of a pulse position modulated sequence of pulses. The invention relates equally to a modulating system comprising such a phase modulator and to a corresponding method.

20 Claims, 10 Drawing Sheets

PULSE MODULATION

FIELD OF THE INVENTION

The invention relates to a pulse modulator. The invention relates equally to a modulating system comprising such a pulse modulator and to a method for modulating pulses.

BACKGROUND OF THE INVENTION

Pulse modulators are known in the art for example in form of pulse position modulation (PPM) modulators and pulse width modulation (PWM) modulators. A PPM modulator codes a modulating signal into a two-level signal that has pulses at varying positions, while a PWM modulator codes a modulating signal into a two-level signal that has pulses of varying widths. PPM modulators and PWM modulators are utilized for instance in new transmitter architectures employed in mobile devices.

Energy efficient multistandard mobile devices require an optimized transmitter (TX) chain. Such optimized transmitter chains comprise usually high efficiency switching mode power amplifiers, which do not affect the phase of an input signal, but which are very non-linear concerning the amplitude of an input signal. Thus, the input signal of a high efficiency switching mode power amplifier should be a phase modulated constant envelope signal, as provided e.g. by a pulse modulator or a bandpass delta-sigma modulator. Switching mode power amplifiers using PPM or PWM for generating bandpass signals in a multimode mobile device transmitter have been described for instance in U.S. patent application 2003/0058956 A1. The use of a bandpass delta-sigma modulator has been described for example by A. Jayaraman in the article "Linear high efficiency microwave power amplifiers using bandpass delta-sigma modulators", IEEE microwave and guided wave letters, vol. 8, No. 3, March 1998.

However, in the present mobile communication standards, the carrier frequencies are specified to lie in a region of 1–2 GHz. A common obstacle for the systems of both of the above cited documents is a need of a very high frequency clock, in case the specified carrier frequencies are to be supported. In order to implement a PPM modulator or a PWM modulator which supports a modulating signal in a frequency range of 1–2 GHz, usually a clock is needed which has a frequency from eight to sixteen times the carrier frequency, that is a frequency of 8–16 GHz. This required very high clock frequency is presently an obstacle for implementing a transmitter architecture for mobile devices which is based on PPM or PWM.

For illustration, a known solution to realize a digital PPM modulator 1 is presented in FIG. 1.

The modulator 1 comprises a word generator 11, which is connected to a phase accumulator 12. The phase accumulator 12 is connected to a signal input of a binary adder 13. A modulating signal is applied to another signal input of the binary adder 13. A clock signal generator 14 is connected to a clock input of the phase accumulator 12 and to a clock input of the binary adder 13. The output of the binary adder is connected to a bus branch 15, which provides the output signal of the modulator 1.

The modulator 1 operates as follows.

The word generator 11 provides a generated phase word to the phase accumulator 12. The phase accumulator 12 creates a digital sawtooth wave, the frequency of the sawtooth wave being determined by the provided phase word. The clock signal generator 14 provides a clock to the clock input of the phase accumulator 12 and defines thereby the accumulation rate of the phase accumulator 12. The generated sawtooth wave is fed to the binary adder 13 together with a modulating signal.

The modulating signal and the sawtooth wave are then added in the binary adder 13. The digital sawtooth wave cause the binary adder to overflow at periodic moments depending on the respective level of the modulating signal. The bus branch 15 is then used for choosing a single bit output from the binary adder indicating the time of this overflow. As a result, a PPM modulation is obtained. In order to achieve an acceptable modulation accuracy, the clock frequency has to be at least eighth times higher than the carrier frequency, i.e. than the frequency with which a new value of the modulating signal is provided.

A digital PPM or PWM is therefore usually not used for high carrier frequencies. Instead, the PPM or PWM is usually created in an analogue domain.

A known method to produce a PPM and a PWM in an analogue domain is illustrated in FIGS. 2a and 2b, which were taken from the document "Communication systems, An introduction to signals and noise in electrical communication", 3 rd edition, McGRAW-HILL 1986, ISBN 0-007-100560-9, by A. B. Carlson.

FIG. 2a is a block diagram of an analog pulse position modulator. A comparator 21 comprises a first input for receiving a modulating signal x(t) and a second, inverting input to which a sawtooth generator 22 is connected. The output of the comparator 21 constitutes on the one hand a first output of the modulator. On the other hand, the output of the comparator 21 is connected via a monostable 23 to a second output of the modulator.

FIG. 2b presents three diagrams with signals occurring in the modulator of FIG. 2a. An upper diagram shows an analog modulating signal x(t) input to the first input of the comparator 21 over time t. In addition, the upper diagram shows an analog sawtooth waveform over time t, which is generated by the sawtooth generator 22 and provided to the second, inverting input of the comparator 21.

The comparator 21 compares the received signals to produce the sequence of PWM pulses shown in a middle diagram of FIG. 2b over time t. In the figure, the PWM pulses are referred to as pulse density modulation (PDM) pulses. More specifically, a respective pulse has a rising edge when the sawtooth waveform has a falling edge, and a falling edge when the amplitude of the subsequent rising flank of the sawtooth waveform becomes equal to the modulating signal. In case PPM pulses are desired instead of PWM pulses, the generated PWM pulses are fed to the monostable 23, which produces equal length pulses whenever the comparator 21 detects that a rising flank of the sawtooth waveform becomes equal to the modulating signal, i.e. whenever there is a falling edge of a PWM pulse. The resulting PPM pulses are shown in a lower diagram of FIG. 2b over time t.

In this analog solution, the frequency of the sawtooth waveform has to be about eight times higher than the modulation frequency.

SUMMARY OF THE INVENTION

It is an object of the invention to provide an alternative to existing solutions enabling a pulse modulation. It is further an object of the invention to enable an improved pulse modulation for the case the modulating signal has a high carrier frequency. It is in particular an object of the invention to avoid high frequency clock related problems in existing solutions enabling a pulse modulation.

A pulse modulator is proposed which comprises a delay arrangement for receiving a first regular sequence of pulses and for delaying each received pulse several times to obtain a plurality of regular sequences of pulses having different phases. The proposed pulse modulator further comprises a selection component for receiving from the delay arrangement a plurality of regular sequences of pulses having different phases, for receiving a modulating signal, wherein each possible value of the modulating signal is associated to one of the different phases, for selecting for each pulse of the first regular sequence of pulses a pulse of the respective regular sequence of pulses which sequence of pulses has a phase associated to a current value of the modulating signal, and for outputting the selected pulse as part of a pulse position modulated sequence of pulses.

Equally, a modulating system comprising such a pulse modulator is proposed. Such a modulating system can be, for example, a transmitter or a mobile device.

Finally, a method of generating a modulated sequence of pulses is proposed. The proposed method comprises a step of generating a first regular sequence of pulses. The proposed method further comprises a step of delaying each of the generated pulses several times to obtain a plurality of regular sequences of pulses having different phases, wherein each possible value of a provided modulating signal is associated to one of these different phases. The proposed method further comprises a step of selecting for each pulse of the first regular sequence of pulses a pulse of the respective regular sequence of pulses which sequence of pulses has a phase associated to a current value of the modulating signal. The proposed method moreover comprises a step of providing the respectively selected pulse as part of a pulse position modulated sequence of pulses.

The invention proceeds from the consideration that the frequency of a signal which forms the basis of a pulse position modulated sequence of pulses can be reduced significantly, if this signal is a sequence of pulses which is delayed several times. Each delayed pulse constitutes an additional pulse at a different temporal position relative to the original pulse. If an original regular sequence of pulses is delayed several times, the delay results in several regular sequence of pulses having different phases. The frequency of the pulses of all resulting regular sequences of pulses together is obviously much higher than the frequency of the pulses of the original regular sequences of pulses. A respective pulse of one of these achieved regular sequences of pulses can then be selected depending on the current value of a modulating signal with the frequency of the pulses of the original regular sequence of pulses.

It is an advantage of the invention that it enables a PPM modulation at the carrier clock frequency. That is, the modulation can be based on pulses which are provided with the same frequency as the modulating signal. The frequency of the provided pulses can thus be at least eight times lower than the frequency employed by a clock signal generator in conventional solutions.

As a result, it is possible, for example, to implement a digital pulse modulator with a standard digital semiconductor process without a very high frequency clock. Also cheaper digital processes can be used.

It is further an advantage of the invention that the required silicon area and the power consumption of the pulse modulator is reduced significantly due to a reduced amount of required logic gates and the smaller clock frequency.

The invention is primarily suited for obtaining a PPM modulation. The achieved PPM modulation can be converted easily to a PWM modulation or any other pulse modulation.

The delay arrangement may comprise a synchronization input for enabling a synchronization of delays applied by the delay arrangement to received pulses by means of an applied clock signal. The clock signal has preferably a frequency which exceeds the frequency of pulses of the first regular sequence of pulses by a factor which is equal to the number of the different phases generated by the delay arrangement.

A conventional pulse modulator, which uses a phase accumulator and adders as shown in FIG. 1, has the benefit that the frequency channel of the PPM/PWM-modulation can be changed easily by applying a new control word to the phase accumulator. The conventional pulse modulator also provides dither to the created sawtooth signal, because the phase accumulator overflow occurs at different moments depending on the applied phase word. This dither improves the adjacent channel power (ACP) figures of the PPM/PWM-modulation, which provide an indication of the spectral purity of the modulation. A good modulator implementation causes only little power on adjacent channels. The pulse modulator according to the invention can be designed to offer the same functions via a different technique. The frequency channel can be changed by changing the frequency of the pulses of the first regular sequence of pulses, for example such that this frequency is always the same as the carrier frequency of the modulating signal. The delays applied by the delay arrangement have to be adjusted accordingly to correspond to a right dividend of the frequency of the received pulses. More specifically, the delay is increased if the carrier frequency is decreased and decreased if the carrier frequency is increased. A delay adjustment can be achieved for example with a control current or a control voltage applied to delay elements of the delay arrangement. If synchronous delays are applied by the delay arrangement, e.g. by a shift register, the delays can be changed by changing the frequency of a clock signal which is used for the synchronization.

The invention can be employed for realizing a digital pulse modulation or an analog pulse modulation. In a digital implementation, the delays can be created in the delay arrangement of the proposed pulse modulator for instance by means of a high frequency clocked register chain. In an analog implementation, the delays can be created in the delay arrangement for instance by means of analog delay nodes functioning as delay elements. In the latter case, no high frequency clock is present.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE FIGURES

FIG. 2b illustrates signals occurring in the modulator of FIG. 2a;

DETAILED DESCRIPTION OF THE INVENTION

Figure 3:
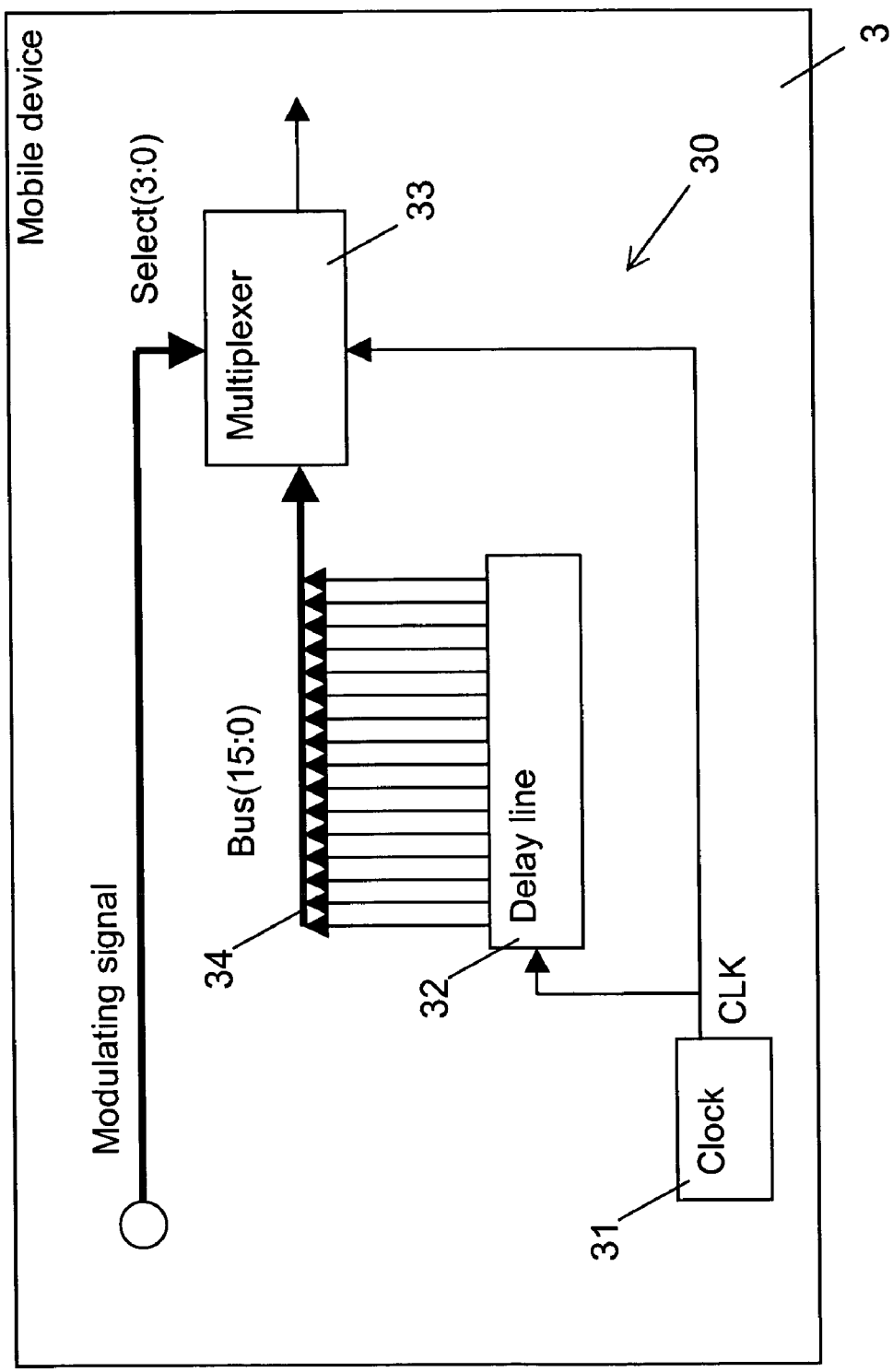
FIG. 3 is a schematic block diagram of an embodiment of a digital PPM modulator according to the invention.

FIG. 3 schematically presents an embodiment of a digital PPM modulator 30 according to the invention. The digital PPM modulator 30 can be integrated for example in a transmitter chain of a mobile device 3.

The digital PPM modulator 30 comprises a clock signal generator 31, which is connected to a delay line 32 and in addition to a clock input of the multiplexer 33. The delay line has sixteen outputs, which are connected via a bus to a further input of the multiplexer 33. The multiplexer 33 moreover comprises a 4-bit selection input for a modulating signal.

Figure 4:
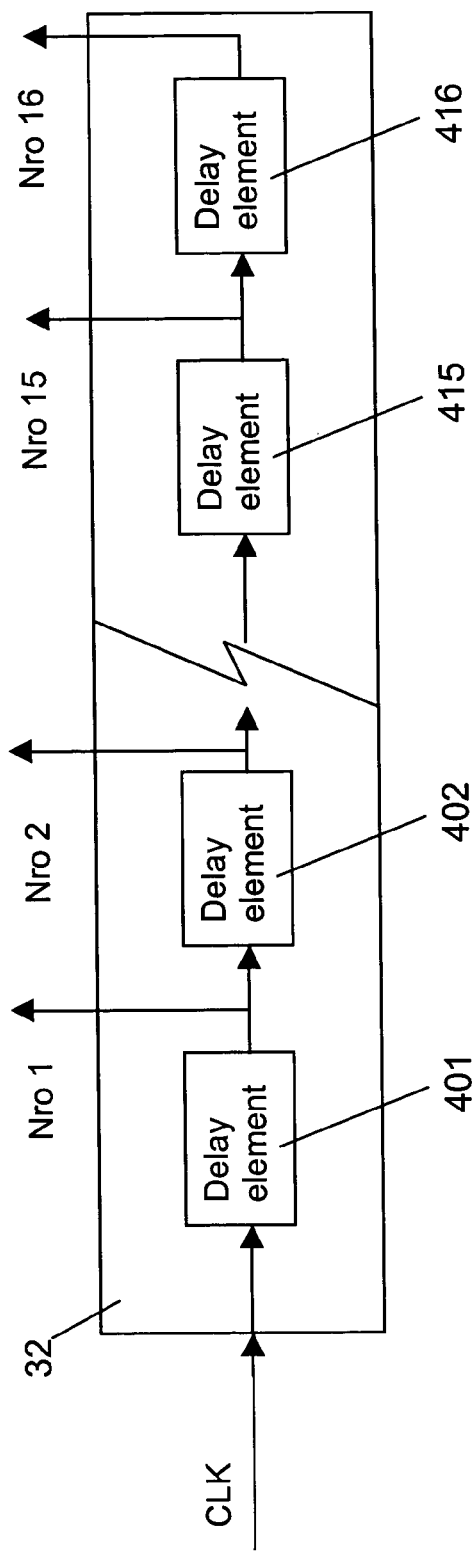
FIG. 4 is a schematic block diagram illustrating the principle structure of a delay line used in the modulator of FIG. 3.

The principle structure of the delay line 32 is shown in more detail in FIG. 4. The delay line 32 comprises sixteen delay elements 401 to 416, which are connected to each other in series. Only the first two delay elements 401, 402 and the last two delay elements 415, 416 of the sixteen delay elements are depicted. The input of the delay line 32 is connected to the input of the first one of the delay elements 401. The respective output Nro1 to Nro16 of each of the delay elements 401 to 416 is connected to the bus of FIG. 3.

Now, the operation of the digital PPM modulator 30 of FIG. 3 will be described.

The clock signal generator 31 generates clock signals CLK with a frequency corresponding to the carrier frequency employed for a modulating signal. The clock signals CLK have the form of pulses and are fed to the delay line 32 and to a clock input of the multiplexer 33. The clock signal generator 31 thus constitutes a pulse generator.

Each received pulse is split up by the delay line 32 to sixteen pulses at different temporal positions. More specifically, each generated pulse is provided to the first delay element 401, which delays the received pulse. The delayed pulse is then fed via the bus 34 to the multiplexer 33. In addition, the delayed pulse is provided to the second delay element 402. The second delay element 402 delays the received pulse further. The twice delayed pulse is equally fed via the bus 34 to the multiplexer 33 and in addition to the next delay element. This procedure is repeated for all delay elements 401 to 416, until the sixteenth delay element 416 is reached. The sixteenth delay element 416 delays the received pulse once further. The sixteen-fold delayed pulse is only fed via the bus 34 to the multiplexer 33. Considering the entire sequences of pulses provided by the clock signal generator 31 to the delay line 32, the delay line 32 thus outputs sixteen identical sequences of pulses having sixteen different phases.

The multiplexer 33 thus receives after each clock signal CLK from the clock signal generator 31 sixteen pulses at sixteen different temporal positions via the bus 34. The multiplexer 33 receives in addition a 4-bit modulating signal with a frequency which corresponds to the clock frequency. The respective value of the modulating signal is used for selecting one of the delayed pulses as the output signal. The number of delay elements 401 to 416 in the delay line 32 and thus the number of the different pulse positions determines the accuracy of the modulation of the output signal. In the present example, each one of the 16 possible values of the modulating signal is associated to another one of the temporal pulse positions. Alternatively, in case there are more possible values of the modulating signal than temporal pulse positions, also groups of neighboring values could be associated to a respective one of the temporal pulse positions.

The signal output by the multiplexer 33 is a PPM modulated signal which has a frequency which corresponds to the clock frequency and the carrier frequency. Thus, no high frequency clock signal is required for the actual PPM modulation.

Figure 5:
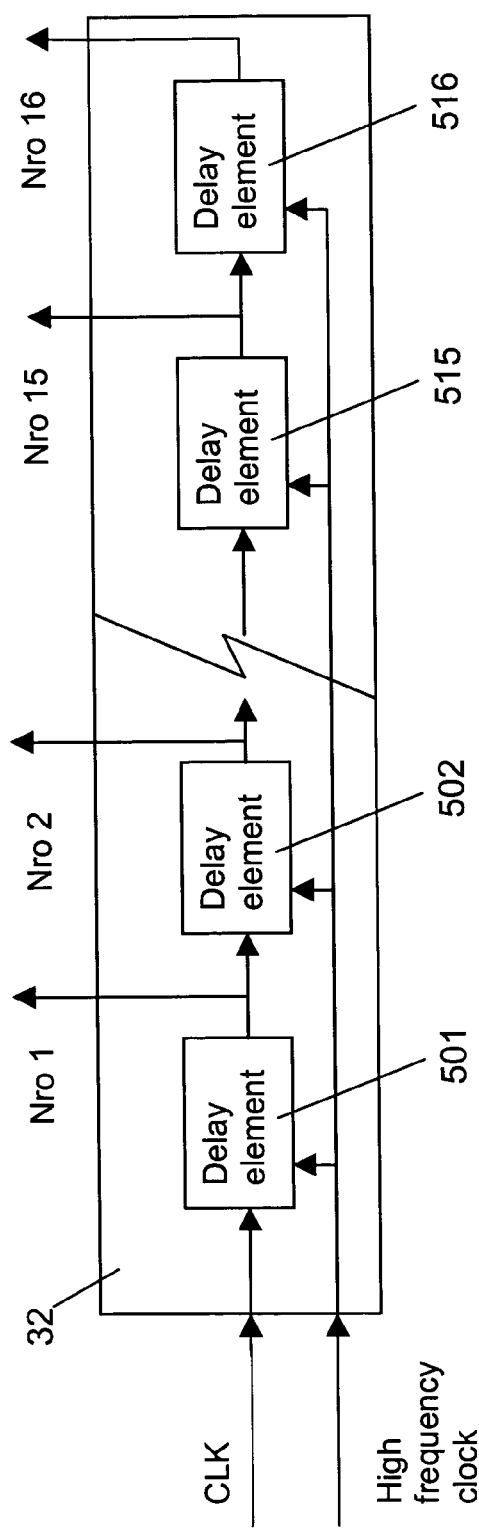
FIG. 5 is a schematic block diagram illustrating a synchronous delay line which can be used in the modulator of FIG. 3.

The delay line depicted in FIG. 4 can be realized for instance with a shift register. Such a shift register can be synchronized by means of a high frequency clock signal, as illustrated in FIG. 5. FIG. 5 shows again the delay line 32 with sixteen delay elements 501 to 516 connected to each other in series. These delay elements 501 to 516 form a shift register. Only the first two delay elements 501, 502 and the last two delay elements 515, 516 of the shift register are depicted. Here, the delay line 32 has in addition a high frequency clock input, which is connected to a respective synchronization input of each of the delay elements 501 to 516. For the synchronization, a high frequency clock signal is fed via the high frequency clock input of the delay line 32 as synchronization signal to the synchronization inputs of the delay elements 501 to 516. The synchronization signal indicates when a pulse which has been received by one of the delay elements 501 to 516 is to be output again. The high frequency clock signal used as the synchronization signal has to be sixteen times as high as the clock frequency of the clock signal generator 31. However, the amount of logic to be clocked with this high frequency clock is significantly reduced compared to conventional PPM modulators.

The performance of the PPM modulator 30 of FIG. 3 using the synchronous delay line of FIG. 5 has been tested with an FPGA (field-programmable gate array) circuit. The PPM modulator 30 was employed for testing more specifically in a system described in the above cited document U.S. 2003/0058956 A1, and for comparison, the conventional PPM modulator depicted in FIG. 1 was employed in a system described in the above cited document U.S. 2003/0058956 A1.

The system comprises a transmitter with a modulator to which in-phase and quadrature components of a modulating signal are fed. The modulator is divided into three portions, namely a low-frequency portion, a radio-frequency portion and a local oscillator, for generating bandpass signals. A balanced switching mode amplifier is coupled to the modulator output to amplify the bandpass signals. A balanced coupling circuit means delivers the amplified bandpass signals to a load. The low-frequency portion of the modulator comprises means for determining the amplitude and the phase information content encoded in the in-phase and quadrature components. The amplitude and the phase content signals are encoded as PPM modulated signals by the PPM modulator according to FIG. 1 and FIG. 3, respectively.

Figure 1:
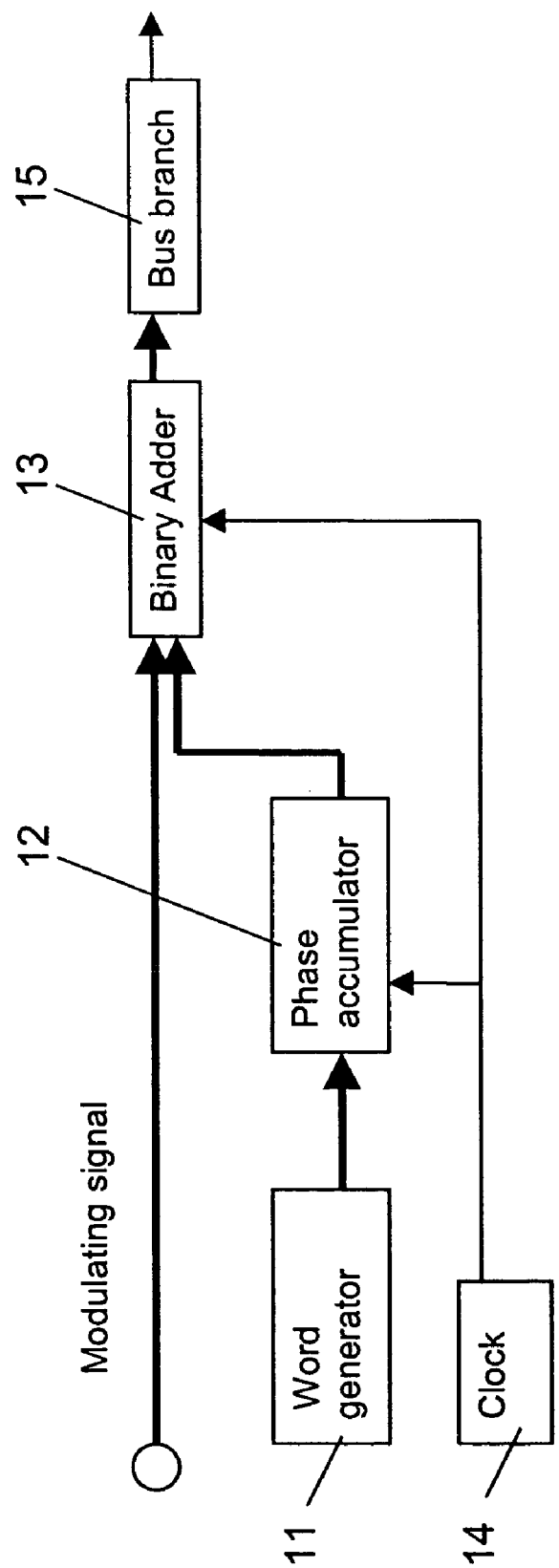
FIG. 1 is a block diagram of a prior art digital PPM modulator.
Figure 2A:
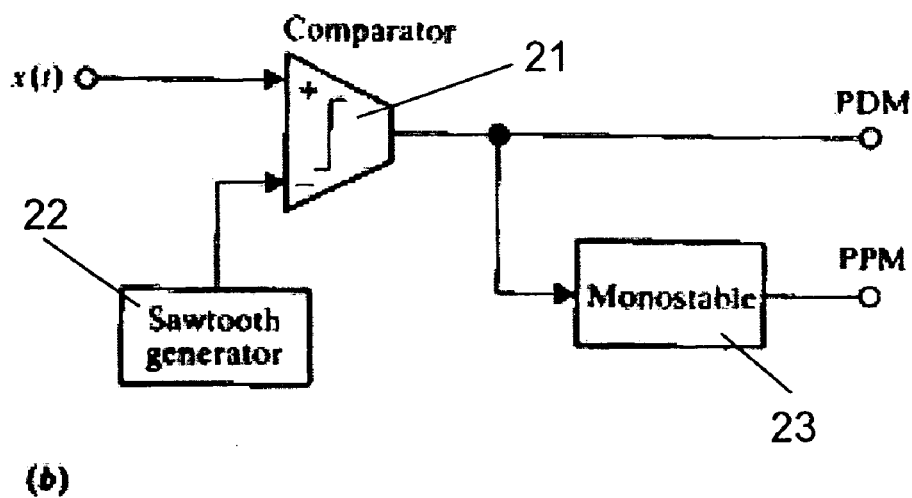
FIG. 2a is a block diagram of a prior art analog PPM/PWM modulator.
Figure 2B:
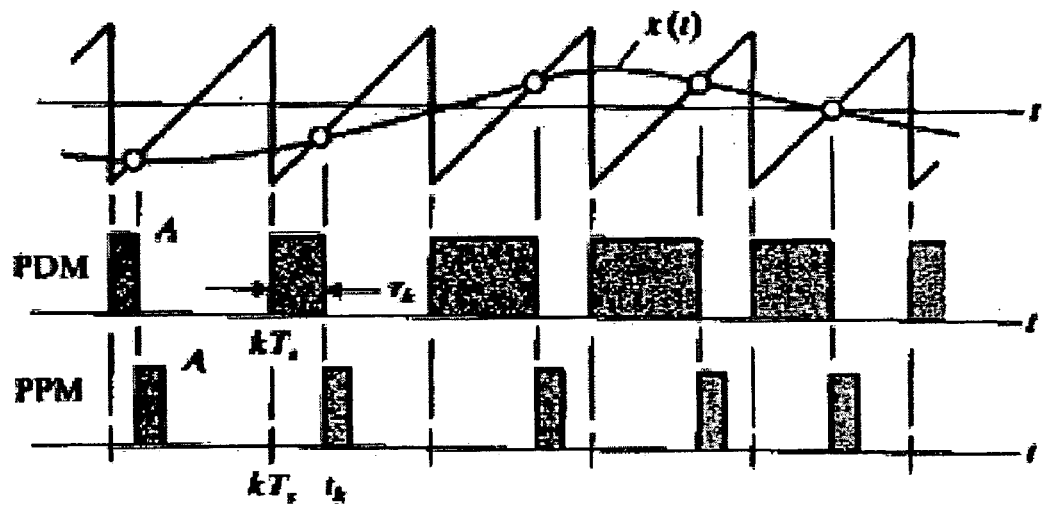
Figure 6:
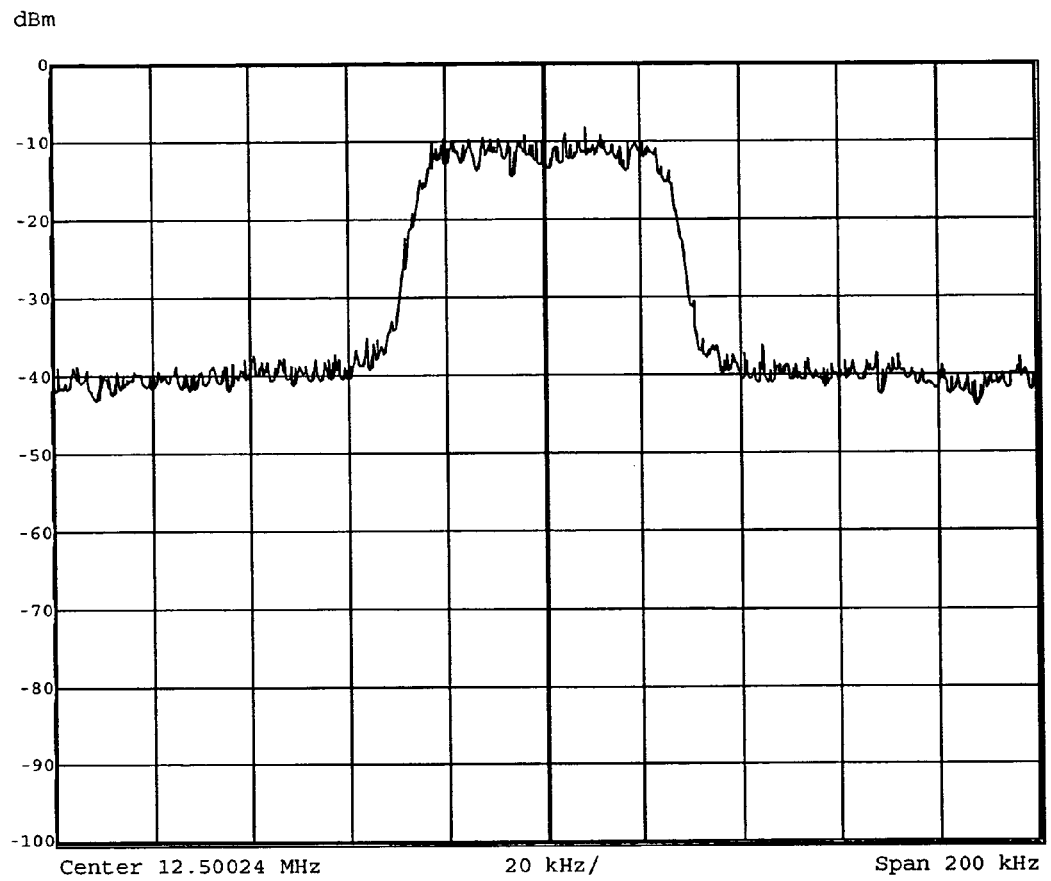
FIG. 6 is a diagram showing the output spectrum of the prior art modulator of FIG. 1 with a span of 200 kHz.

FIG. 6 is a first diagram presenting the output spectrum of the system resulting with the conventional PPM modulator depicted in FIG. 1. More specifically, the attenuation in dBm versus a reference level of 0 dBm is depicted over frequency for a center frequency of 12.50024 MHz and a span of 200 kHz. The scale on the x-axis is 20 kHz per line.

Figure 7:
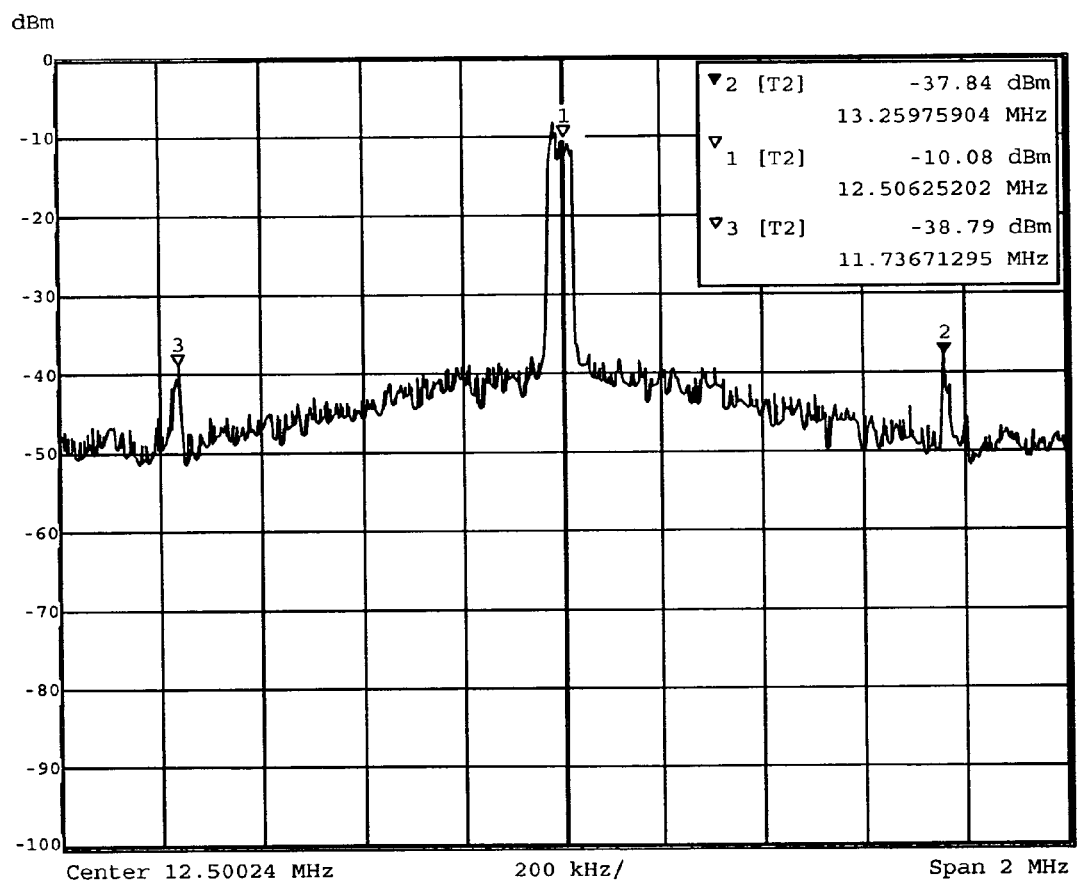
FIG. 7 is a diagram showing the output spectrum of the prior art modulator of FIG. 1 with a span of 2 MHz.

FIG. 7 is a second diagram presenting the output spectrum of the system resulting with the conventional PPM modulator depicted in FIG. 1. More specifically, the attenuation in dBm versus a reference level of 0 dBm is depicted over frequency for a center frequency of 12.50024 MHz and a span of 2 MHz. The scale on the x-axis is 200 kHz per line.

Figure 8:
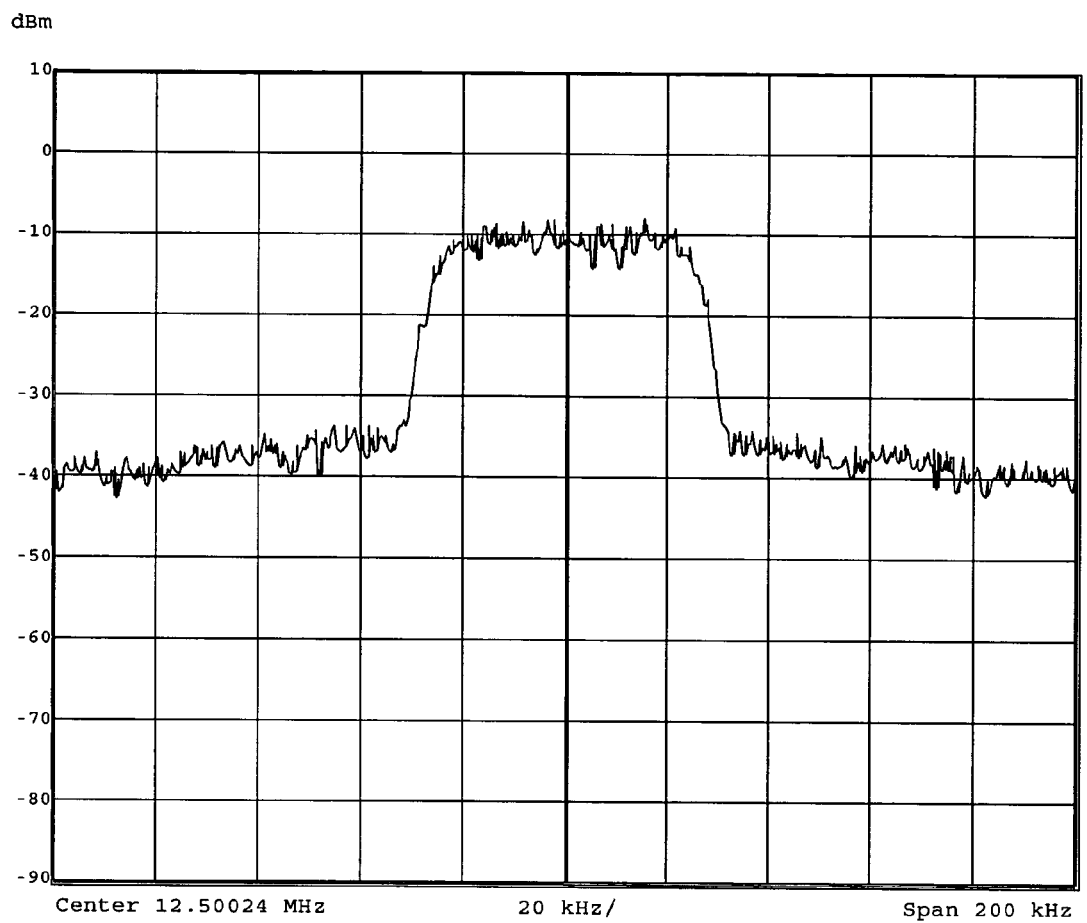
FIG. 8 is a diagram showing the output spectrum of the modulator of FIG. 3 with a span of 200 kHz.

FIG. 8 is a first diagram presenting the output spectrum of the system resulting with the PPM modulator 30 presented in FIG. 3. The attenuation in dBm versus a reference level of 10 dBm is depicted over frequency for a center frequency of 12.50024 MHz and a span of 200 kHz. As in FIG. 6, the scale on the x-axis is 20 kHz per line.

Figure 9:
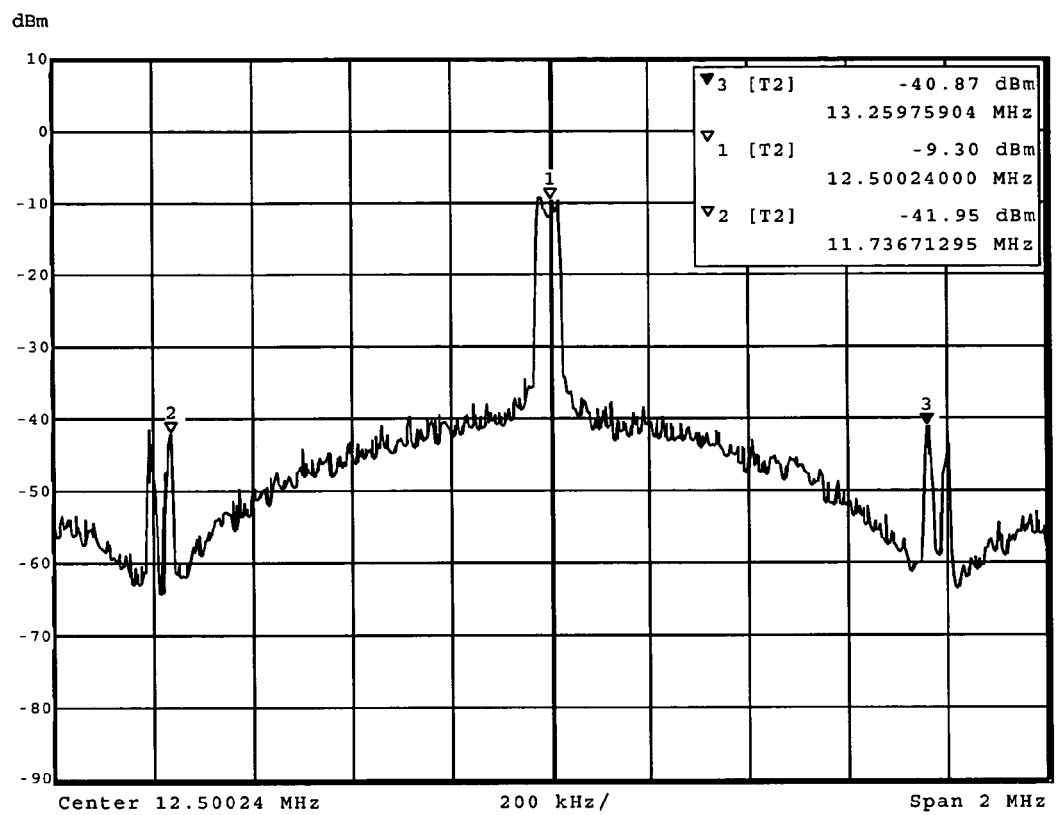
FIG. 9 is a diagram showing the output spectrum of the modulator of FIG. 3 with a span of 2 MHz.

FIG. 9 is a second diagram presenting the output spectrum of the system resulting with the PPM modulator 30 presented in FIG. 3. The attenuation in dBm versus a reference level of 10 dBm is depicted over frequency for a center frequency of 12.50024 MHz and a span of 2 MHz. As in FIG. 7, the scale on the x-axis is 200 kHz per line.

As can be seen, the output spectrum was almost the same with the presented PPM modulator 30 as with the conventional PPM modulator. There is only a slight degradation of the spectrum with the proposed PPM modulator due to the reduced pulse resolution compared to the conventional solution. This is caused by the limited clock frequency of the employed FPGA circuit.

With this slight degradation, the proposed PPM modulator thus constitutes an advantageous alternative to the conventional PPM modulator.

Figure 10:
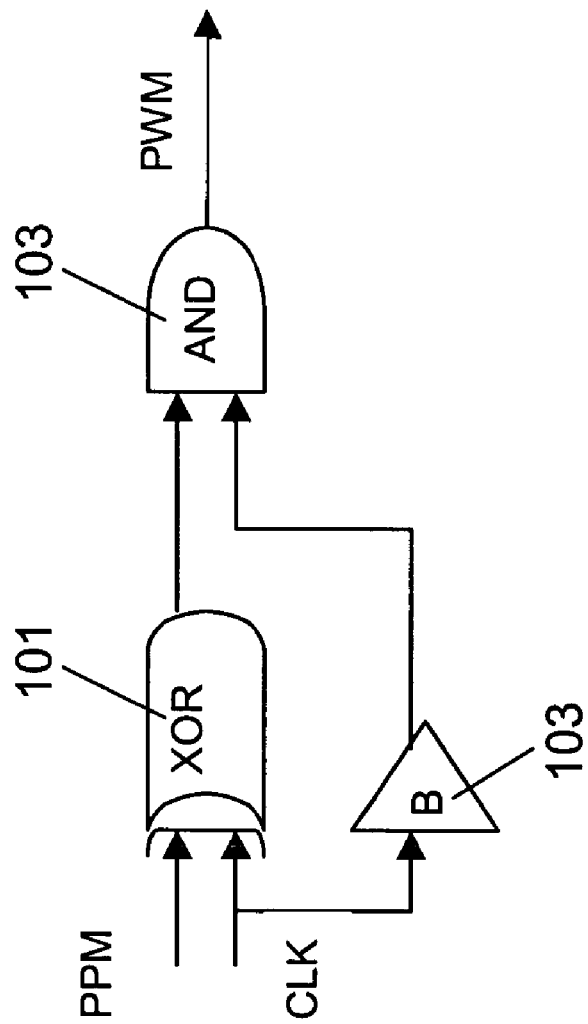
FIG. 10 is a logic circuit for a PPM/PWM conversion which may be added to the PPM modulator of FIG. 3.

If desired, the PPM-modulation achieved with the PPM modulator 30 of FIG. 3 can be converted easily into a PWM-modulation, for instance by adding the logic circuit depicted in FIG. 10 to the PPM modulator 30.

The logic circuit of FIG. 10 comprises an XOR-gate 101, to which the PPM-modulated signal output by the multiplexer 33 is fed. The clock signal CLK provided by the clock signal generator 31 is fed to the second input of the XOR-gate 101. The clock signal CLK is provided in addition to a buffer B 102. The output of the XOR-gate 101 and the buffered clock signal output by the buffer 102 are fed to an AND-gate 103 to form the PWM-modulation. The buffer 102 is used to compensate for the delay in the XOR-gate 101.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A pulse modulator comprising:
 a delay arrangement for receiving a first regular sequence of pulses and for delaying each received pulse several times to obtain a plurality of regular sequences of pulses having different phases, wherein said delay arrangement comprises a shift register; and
 a selection component for receiving from said delay arrangement a plurality of regular sequences of pulses having different phases, for receiving a modulating signal, wherein each possible value of said modulating signal is associated to one of said different phases, for selecting for each pulse of said first regular sequence of pulses a pulse of the respective regular sequence of pulses which sequence of pulses has a phase associated to a current value of said modulating signal, and for outputting said selected pulse as part of a pulse position modulated sequence of pulses.

2. A pulse modulator according to claim 1, wherein said selection component is a multiplexer.

3. A pulse modulator according to claim 1, wherein said delay arrangement comprises a synchronization input for enabling a synchronization of delays applied by said delay arrangement to received pulses by means of a clock signal applied to said synchronization input.

4. A pulse modulator comprising:
 a delay arrangement for receiving a first regular sequence of pulses and for delaying each received pulse several times to obtain a plurality of regular sequences of pulses having different phases; and
 a selection component for receiving from said delay arrangement a plurality of regular sequences of pulses having different phases, for receiving a modulating signal, wherein each possible value of said modulating signal is associated to one of said different phases, for selecting for each pulse of said first regular sequence of pulses a pulse of the respective regular sequence of pulses which sequence of pulses has a phase associated to a current value of said modulating signal, and for outputting said selected pulse as part of a pulse position modulated sequence of pulses; and
 further comprising a pulse generator for generating a regular sequence of pulses and for providing said generated regular sequence of pulses as the first regular sequence of pulses to said delay arrangement and in addition as a clock signal to said selection component.

5. A pulse modulator according to claim 4, wherein said pulse generator further provides said generated regular sequence of pulses as a clock signal to said selection component.

6. A pulse modulator according to claim 4, wherein said pulse generator generates said pulses with a frequency which is equal to the frequency with which values of said modulating signal are provided to said selection component.

7. A pulse modulator according to claim 4, wherein said pulse generator comprises a control input for adapting the frequency of generated pulses to a frequency employed for said modulating signal which is provided to said selection component.

8. A pulse modulator according to claim 1, wherein said delay arrangement comprises a control input for adjusting delays applied by said delay arrangement to received pulses in accordance with a frequency employed for said modulating signal which is provided to said selection component.

9. A pulse modulator according to claim 3, further comprising a clock signal generator for generating said clock signal which is applied to said synchronization input of said delay arrangement, wherein said clock signal generator comprises a control input for adjusting the frequency of said clock signal in accordance with a frequency employed for a modulating signal which is provided to said selection component.

10. A pulse modulator according to claim 1, further comprising a circuit for converting said pulse position modulated sequence of pulses output by said selection component into a corresponding pulse width modulated sequence of pulses.

11. A modulating system comprising a pulse modulator, which pulse modulator includes:
- a delay arrangement for receiving a first regular sequence of pulses and for delaying each received pulse several times to obtain a plurality of regular sequences of pulses having different phases, wherein said delay arrangement comprises a shift register; and
- a selection component for receiving from said delay arrangement a plurality of regular sequences of pulses having different phases, for receiving a modulating signal, wherein each possible value of said modulating signal is associated to one of said different phases, for selecting for each pulse of said first regular sequence of pulses a pulse of the respective regular sequence of pulses which sequence of pulses has a phase associated to a current value of said modulating signal, and for outputting said selected pulse as part of a pulse position modulated sequence of pulses.

12. A method of generating a modulated sequence of pulses, said method comprising the steps of:
- generating a first regular sequence of pulses;
- delaying via a shift register each of said generated pulses several times to obtain a plurality of regular sequences of pulses having different phases, wherein each possible value of a provided modulating signal is associated to one of said different phases;
- selecting for each pulse of said first regular sequence of pulses a pulse of the respective regular sequence of pulses which sequence of pulses has a phase associated to a current value of said modulating signal; and
- providing a respectively selected pulse as part of a pulse position modulated sequence of pulses.

13. A method according to claim 12, wherein the delays which are applied to said generated pulses are synchronized by a clock signal.

14. A method according to claim 12, wherein said pulses of said first regular sequence of pulses are generated with a frequency which is equal to the frequency with which values of said modulating signal are provided.

15. A method according to claim 12, wherein said pulses of said first regular sequence of pulses are generated with a frequency which is adapted to a frequency employed for said provided modulating signal.

16. A method according to claim 12, wherein the delays which are applied to said generated pulses are adjusted in accordance with said frequency employed for said provided modulating signal.

17. A method according to claim 13, wherein the frequency of said clock signal used for said synchronization is adjusted in accordance with a frequency employed for said provided modulating signal.

18. A method according to claim 12, further comprising converting said provided pulse position modulated sequence of pulses into a corresponding pulse width modulated sequence of pulses.

19. A modulating system comprising a pulse modulator, which pulse modulator includes:
- a delay arrangement for receiving a first regular sequence of pulses and for delaying each received pulse several times to obtain a plurality of regular sequences of pulses having different phases;
- a selection component for receiving from said delay arrangement a plurality of regular sequences of pulses having different phases, for receiving a modulating signal, wherein each possible value of said modulating signal is associated to one of said different phases, for selecting for each pulse of said first regular sequence of pulses a pulse of the respective regular sequence of pulses which sequence of pulses has a phase associated to a current value of said modulating signal, and for outputting said selected pulse as part of a pulse position modulated sequence of pulses; and
- a pulse generator for generating a regular sequence of pulses and for providing said generated regular sequence of pulses as the first regular sequence of pulses to said delay arrangement and in addition as a clock signal to said selection component.

20. A method of generating a modulated sequence of pulses, said method comprising the steps of:
- generating via a pulse generator a regular sequence of pulses;
- providing said generated regular sequence of pulses as a first regular sequence of pulses;
- delaying each of said generated pulses several times to obtain a plurality of regular sequences of pulses having different phases, wherein each possible value of a provided modulating signal is associated to one of said different phases;
- selecting for each pulse of said first regular sequence of pulses a pulse of the respective regular sequence of pulses which sequence of pulses has a phase associated to a current value of said modulating signal, wherein said selecting receives said generated regular sequence of pulses as a clock signal; and
- providing a respectively selected pulse as part of a pulse position modulated sequence of pulses.

* * * * *